United States Patent [19]
Sanger et al.

[11] Patent Number: 6,016,007
[45] Date of Patent: Jan. 18, 2000

[54] POWER ELECTRONICS COOLING APPARATUS

[75] Inventors: Philip Albert Sanger, Monroeville, Pa.; Frank A. Lindberg, Baltimore; Walter Garcen, Glen Burnie, both of Md.

[73] Assignee: Northrop Grumman Corp., Los Angeles, Calif.

[21] Appl. No.: 09/206,242

[22] Filed: Oct. 16, 1998

[51] Int. Cl.⁷ .................................................. H01L 23/34
[52] U.S. Cl. ........................... 257/714; 257/706; 257/707
[58] Field of Search .................................... 257/746, 747, 257/712, 714, 717, 706, 707, 705

[56] References Cited

U.S. PATENT DOCUMENTS

| | | | |
|---|---|---|---|
| 4,196,442 | 4/1980 | Kuniya et al. | 257/746 |
| 4,482,912 | 11/1984 | Chiba et al. | 257/746 |
| 4,482,913 | 11/1984 | Burke et al. | 257/746 |
| 5,126,829 | 6/1992 | Daikoku et al. | 257/714 |
| 5,150,274 | 9/1992 | Okada et al. | 257/714 |
| 5,453,911 | 9/1995 | Wolgemuth et al. | |
| 5,838,063 | 11/1998 | Sylvester. | |
| 5,892,279 | 4/1999 | Nguyen. | |

*Primary Examiner*—Sheila V. Clark

[57] ABSTRACT

A semiconductor cooling arrangement wherein a semiconductor is affixed to a thermally and electrically conducting carrier such as by brazing. The coefficient of thermal expansion of the semiconductor and carrier are closely matched to one another so that during operation they will not be overstressed mechanically due to thermal cycling. Electrical connection is made to the semiconductor and carrier, and a porous metal heat exchanger is thermally connected to the carrier. The heat exchanger is positioned within an electrically insulating cooling assembly having cooling oil flowing therethrough. The arrangement is particularly well adapted for the cooling of high power switching elements in a power bridge.

25 Claims, 9 Drawing Sheets

FIG.13
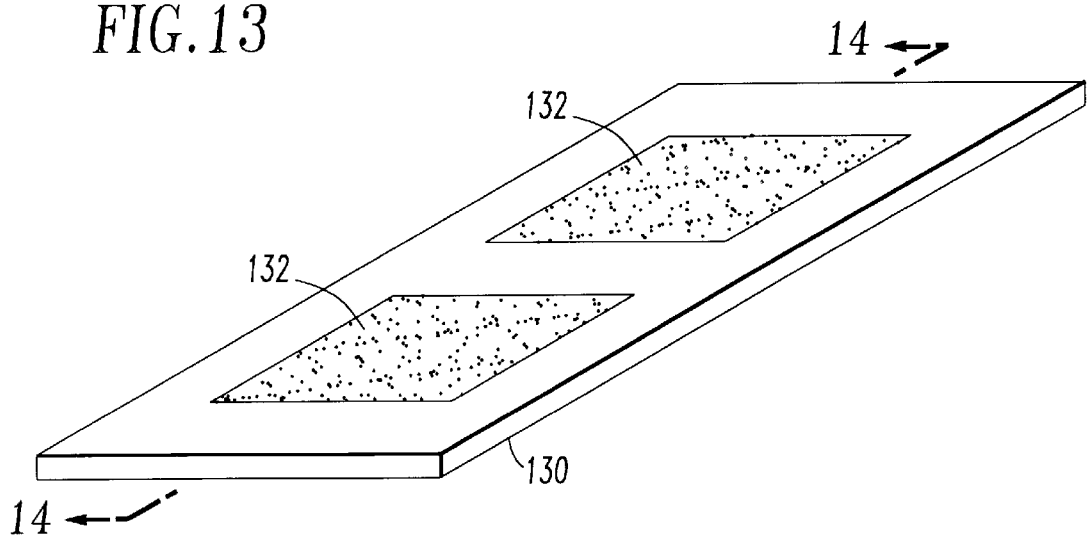
FIG.14 ns of FIG. 7.

POWER ELECTRONICS COOLING APPARATUS

STATEMENT OF GOVERNMENT INTEREST

The Government of the United States of America has rights in this invention pursuant to Contract No. DE-FC36-94GO10017 awarded by the Department of Energy.

BACKGROUND OF THE INVENTION

1. Field of the Invention

The invention in general relates to semiconductor cooling, and more particularly to an improved cooling arrangement for high power semiconductor devices.

2. Description of Related Art

During operation, semiconductor circuits generate heat, particularly high power semiconductor switching devices as may be used in ac to dc or dc to ac power conversion equipment.

The power density in these semiconductor circuits is limited by the ability to provide adequate cooling. With improved cooling, the power density can be significantly increased thus allowing for a reduced amount of semiconductor material and a substantial cost savings. In addition, the improved cooling results in a longer thermal cycle life for the semiconductors and a higher reliability for the switching circuitry.

Presently used cooling arrangements include the use of a liquid cooled metallic heat sink to which a semiconductor package is mounted. Heat generated during operation of the circuitry is conducted to the bottom surface of the package, and then to the liquid cooled heat sink. This arrangement however suffers from an objectionably high thermal resistance not only through the semiconductor package but also across the package-heat sink interface.

Certain other cooling arrangements bond a common planar electrode of the semiconductor circuit directly to an electrically insulating, thermally conducting ceramic member such as aluminum oxide, aluminum nitride or beryllium oxide, by way of example. The ceramic member in turn is coupled to a liquid cooled heat sink. Although this arrangement provides satisfactory cooling, an even more efficient improved cooling arrangement would provide for a more economical system. The present invention provides such improved arrangement.

SUMMARY OF THE INVENTION

Cooling apparatus according to the present invention includes a semiconductor device having a certain coefficient of thermal expansion (CTE). The semiconductor device is mounted to a first side of a thermally and electrically conductive carrier member having a CTE which closely matches that of the semiconductor device. The difference between the CTEs of the carrier and semiconductor device is preferably no more than about 1 to 2 parts per million per degree centigrade. Means are provided for making electrical connection with the semiconductor device on one side thereof and means are provided for making electrical connection with the carrier. A cooling assembly is thermally coupled to a second side of the carrier and in a preferred embodiment includes a heat exchanger through which flows a dielectric cooling fluid.

BRIEF DESCRIPTION OF THE DRAWINGS

FIG. 13 is a view of an alternate embodiment of a bus bar structure.

FIG. 14 is a view along line 14—14 of FIG. 13.

DESCRIPTION OF THE PREFERRED EMBODIMENT

Figure 1:
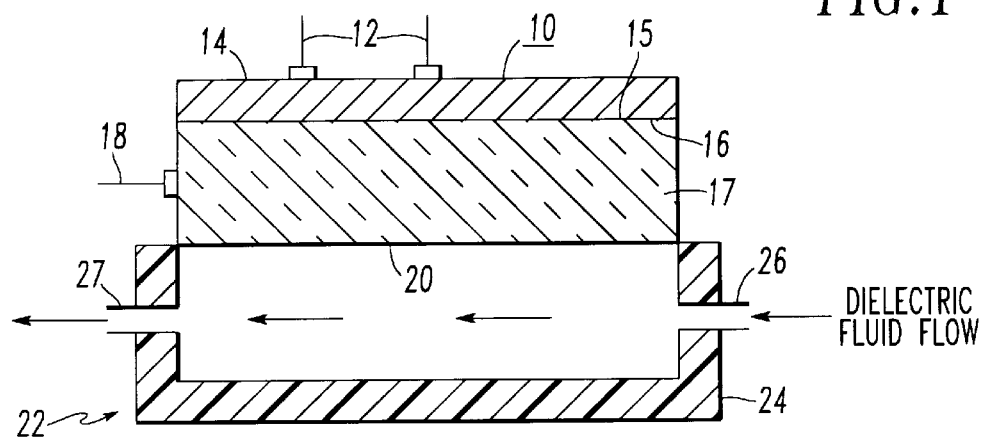
FIGS. 1, 2 and 3 are cross-sectional views of various embodiments of the present invention.

In the drawings, which are not necessarily to scale, like or corresponding parts are denoted by like or corresponding reference numerals.

FIG. 1 basically illustrates one concept of the present invention. A semiconductor chip 10, which may incorporate one or more integrated circuits, includes means for making electrical contact in the form of one or more leads 12 connected to a first surface 14. The semiconductor 10 is intimately bonded, such as by brazing its second surface 15, to a first surface 16 of a thermally and electrically conductive carrier 17, to which lead 18 is connected for making electrical contact with the semiconductor circuit or circuits via carrier 17.

The semiconductor 10 may be of any one of a number of well known materials used for such circuits, such as silicon and silicon carbide, by way of example. The semiconductor has a certain coefficient of thermal expansion (CTE), described as the fractional change in length per degree rise in temperature. During operation, where thermal cycling occurs, the semiconductor 10 will elongate and contract. In order to maintain the integrity of the intimate bond between the semiconductor 10 and the carrier 17, and to prevent cracking of the semiconductor, the carrier is designed to have a CTE compatible with that of the semiconductor.

An ideal compatibility would be an exact match of CTEs so that they expand and contract at the same rate, however, satisfactory results may be obtained if the difference in CTEs between the semiconductor 10 and carrier 17 is no more than about 1 to 2 ppm per degree centigrade.

Thermally and electrically conductive carrier 17 includes a second surface 20 in heat transfer relationship with a cooling assembly 22 operable to remove generated heat flowing from the semiconductor 10 through the carrier 17. Cooling assembly 22 includes a housing 24 which is fabricated from an electrically insulating material such as plastic. A dielectric cooling fluid such as oil is introduced into the housing 24 via inlet port 26. This fluid removes heat from surface 20 of carrier 17 and exits via outlet port 27.

Figure 2:
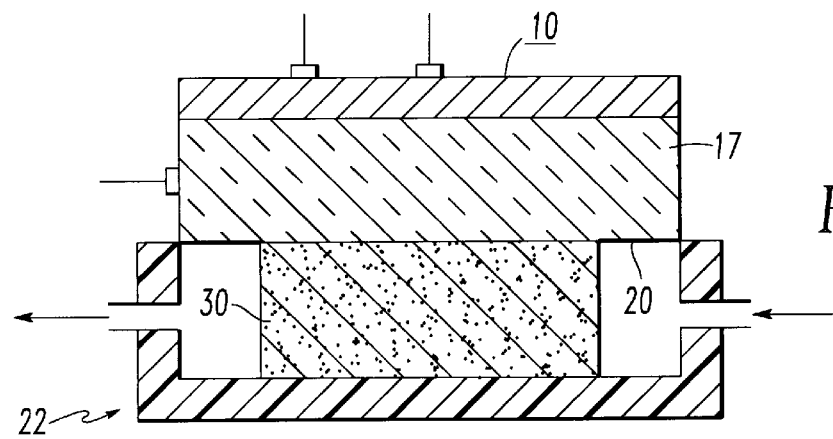

In order to significantly increase the heat transfer and removal, and with reference to FIG. 2, the cooling assembly 22 preferably includes a heat exchanger 30 bonded to surface 20 of carrier 17. The heat exchanger 30 may be fabricated as metal burrs or fins, or in a preferred embodiment as a porous metal block. Such porous metal structure is a commercially available item comprised of small metal spheres such as copper, brazed together as a unitary unit having interstices. This construction results in significant increases in the surface area of the heat exchanger and cooling fluid velocities, thereby increasing cooling capability.

Figure 3:
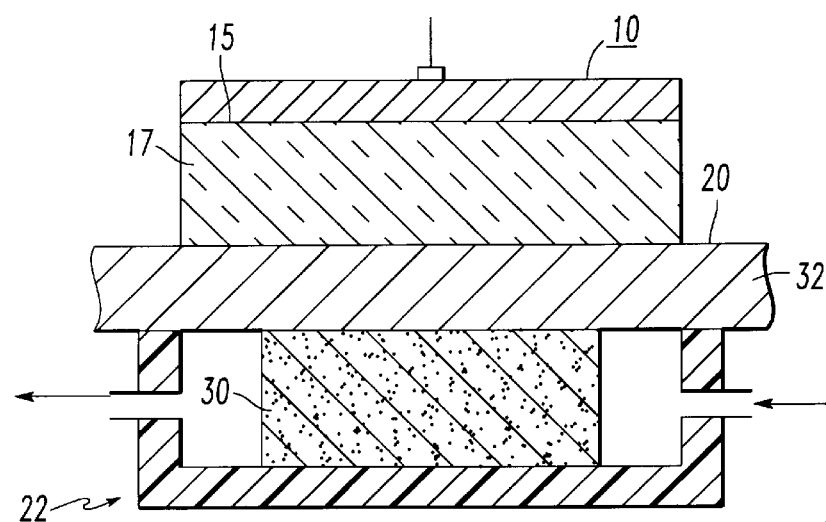

In contrast to other cooling arrangements in which a semiconductor is bonded to an electrically insulating carrier, such as beryllium oxide, the carrier of the present invention is an electrical conductor as well as a thermal conductor. Accordingly, FIG. 3 illustrates an alternate means for making electrical connection to the second surface of semiconductor 10. More particularly, in FIG. 3 there is included a metal bus 32, such as copper, electrically connected to the second surface 20 of carrier 17, such connection being made by soldering, which will allow for slight relative movement between the carrier 17 and bus 32 during thermal cycling. Heat exchanger 30, also of copper, is brazed to the undersurface of bus 32 for intimate low thermal resistance heat transfer.

As previously stated, the CTE of the carrier 17 closely matches that of the semiconductor 10. The carrier may be made of a combination of metals such as copper and molybdenum or copper and tungsten. An even closer match to the semiconductor CTE, and a better thermal conductor may be achieved by the use of a metal matrix composite which provides the necessary thermal and electrical conductivity requirements for the carrier 17.

Figure 4:
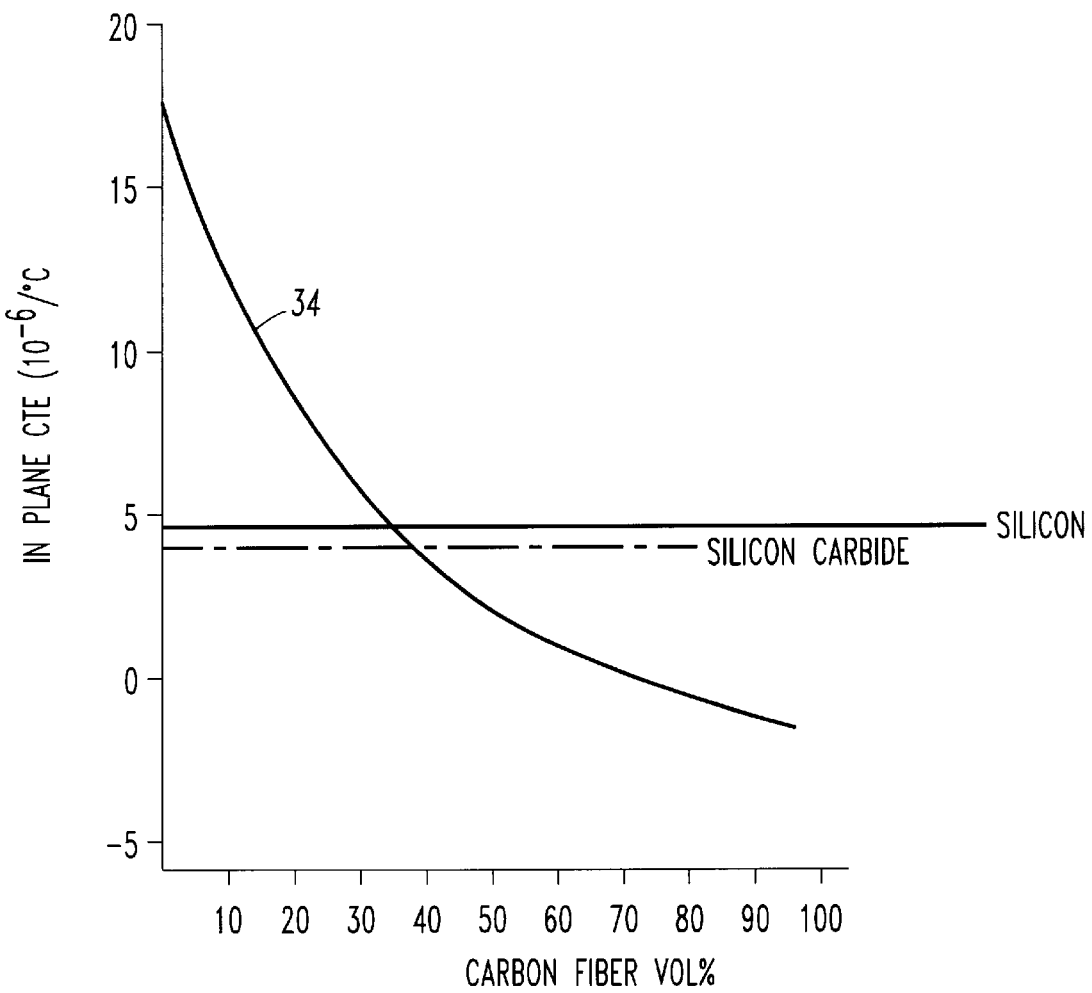
FIG. 4 is a curve illustrating the CTE of a copper/carbon metal matrix composition as a function of carbon fiber content.

Such metal matrix composite may be aluminum or copper based. By way of example, the carrier may be formulated of a copper/graphite (carbon) composition, and curve 34 of FIG. 4 illustrates the variation of the CTE of the metal matrix composite as a function of carbon fiber volume percent. A semiconductor 10 of silicon for example may typically have a CTE of around 4.6. A copper based metal matrix composite with a 38% carbon fiber content will result in a carrier with a CTE which matches that of the silicon semiconductor. Similarly, the fiber content may be varied to match typical CTEs of other semiconductors such as silicon carbide (typical CTE of 4.3), as illustrated in FIG. 4.

Figure 5:
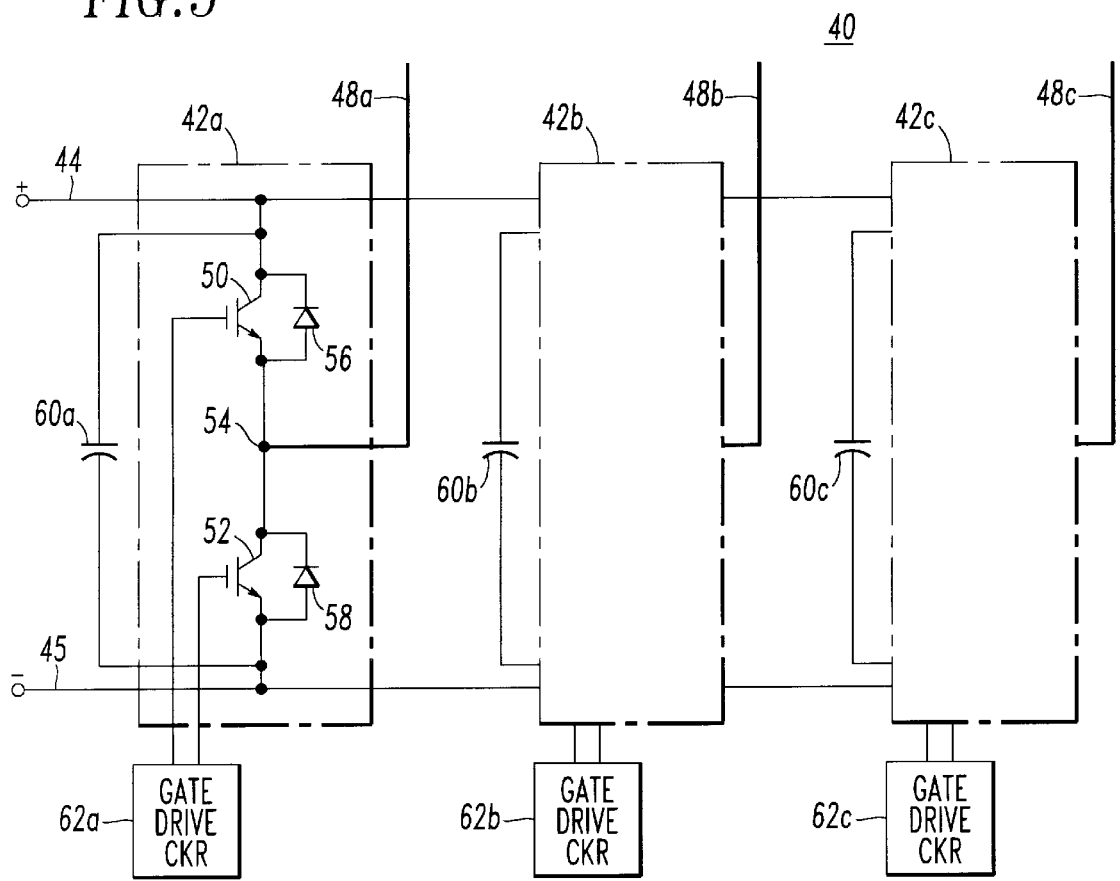
FIG. 5 is a power bridge circuit in which the present invention finds utility.

The present invention may be used in the cooling of various semiconductor circuits and is particularly well adapted for use in high power circuits such as high power ac to dc or dc to ac converters. For example FIG. 5 illustrates a three phase power bridge circuit 40 which utilizes high power switching devices to generate an ac signal from a dc battery source to drive an electric motor in an electric vehicle propulsion system. The operation of such circuit is described in U.S. Pat. Nos. 5,504,378, 5,517,063 and the various patents listed therein, and hereby incorporated by reference.

Basically, the power bridge 40 incorporates a phase A switching circuit 42a, a phase B switching circuit 42b, and a phase C switching circuit 42c, all connected to respective positive and negative input buses 44 and 45 and operable to provide three phase alternating current at output buses 48a, 48b and 48c. Switching circuit 42a is exemplary and is seen to include switching devices 50 and 52 serially connected across input buses 44,45, with output bus 48a connected to the junction 54 between them. These switching circuits 42a, 42b and 42c are also known as poles.

Each switching device 50,52 is constituted by an insulated gate bipolar transistor (IGBT) which is used because of its high current density, small conduction losses and small size and weight. Such IGETs typically have turn on, turn off times measured in microseconds.

Figure 6A:
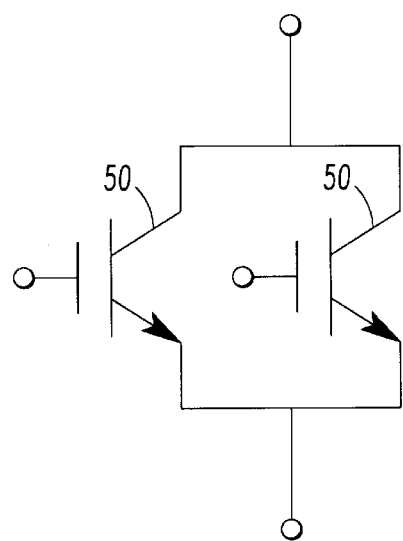
FIGS. 6A and 6B illustrate the use of multiple semiconductor elements in parallel to accommodate higher currents.
Figure 6B:
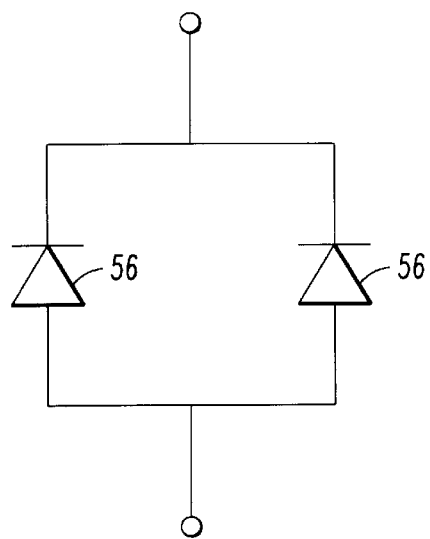

Diodes 56 and 58 are connected across respective IGBTs 50 and 52, and a snubber capacitor 60a is connected between the collector of IGBT 50 and the emitter of IGBT 52. This capacitor functions to reduce voltage overshoot when the IGBT turns off. For high current applications, a number of semiconductor devices may be operated in parallel. By way of example, FIG. 6A illustrates two IGBTs 50 operating as one device and FIG. 6B illustrates two diodes 56 in parallel.

Figure 7:
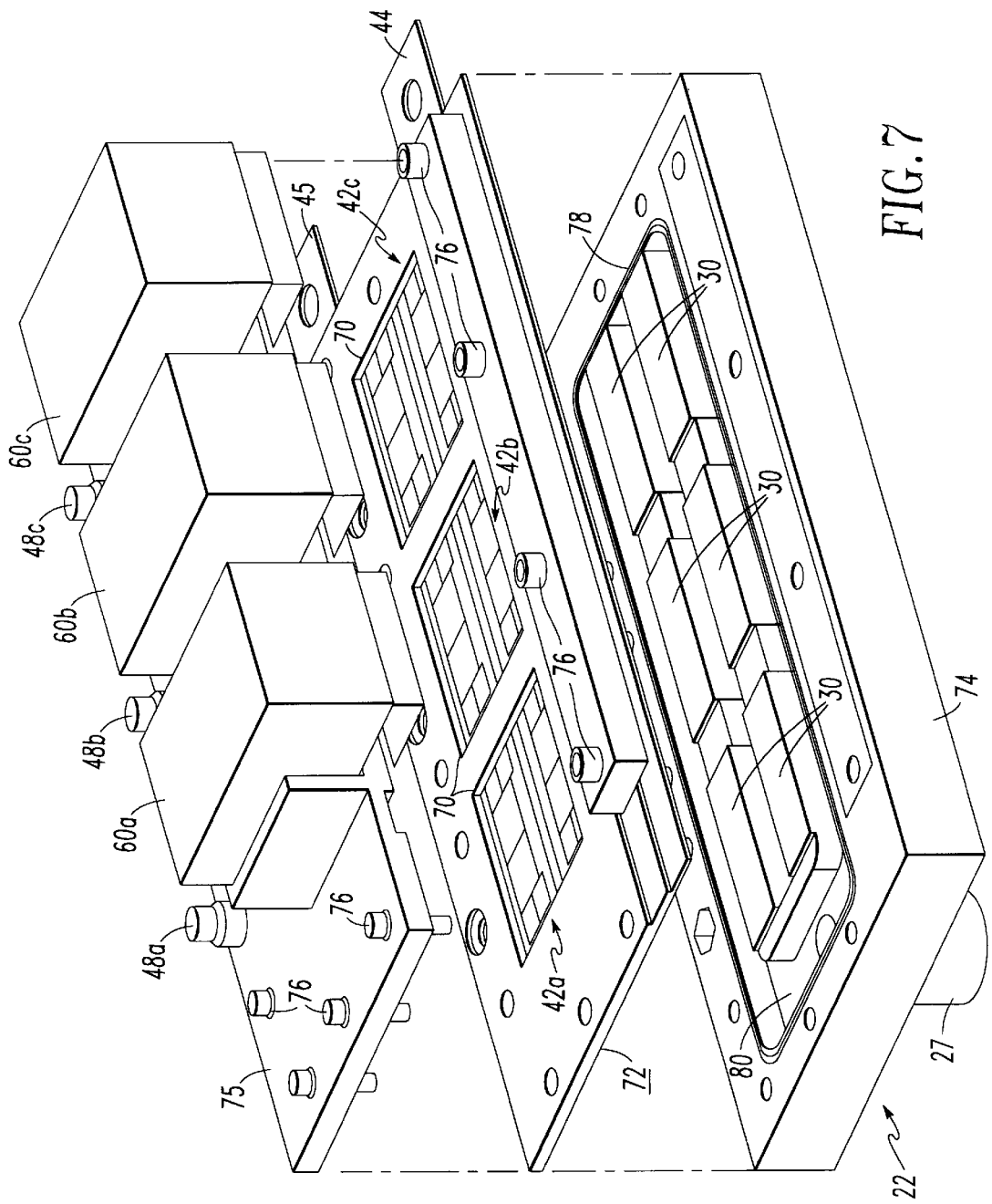
FIG. 7 is an exploded view of the actual circuit components of FIG. 5 along with an improved cooling arrangement.

Referring once again to FIG. 5, the IGBTs 50 and 52 are rapidly switched on and off upon the application of control signals applied to their gates by means of gate drive circuit 62a. During this operation the semiconductor circuits generate heat and can reach temperatures of 150° C. (302° F.) or higher. FIG. 7 illustrates one embodiment of the present invention for removing this heat to ensure for as low a temperature as possible, for high reliability and a high power density in a limited space.

In the following FIGS. components functionally equivalent to those previously described have been given like reference numerals. In FIG. 7 switching circuits 42a, 42b and 42c are disposed within respective windows 70 formed in two layers of a laminated structure 72 positioned between a lower manifold housing 74 and an upper manifold housing 75. (The terms "upper" and "lower" as used herein are descriptive of the FIGS. as illustrated and are not intended to be limiting). As before noted, these housings are electrically insulating, and may be secured to one another by means of fasteners 76. Capacitors 60 are secured to upper housing 75 such as by adhesive and when the upper and lower housings 74 and 75 are fastened together, an O-ring 78 of housing 74 contacts the lower surface of the laminated structure 72 to form a fluid tight seal with the fluid containing interior of the lower housing 74. Not visible in FIG. 7 is a similar O-ring in the underside of the upper housing 75. As will be described, heat sinks 30 are disposed in well 80 in lower housing 74 and form fluid conducting channels.

Figure 8:
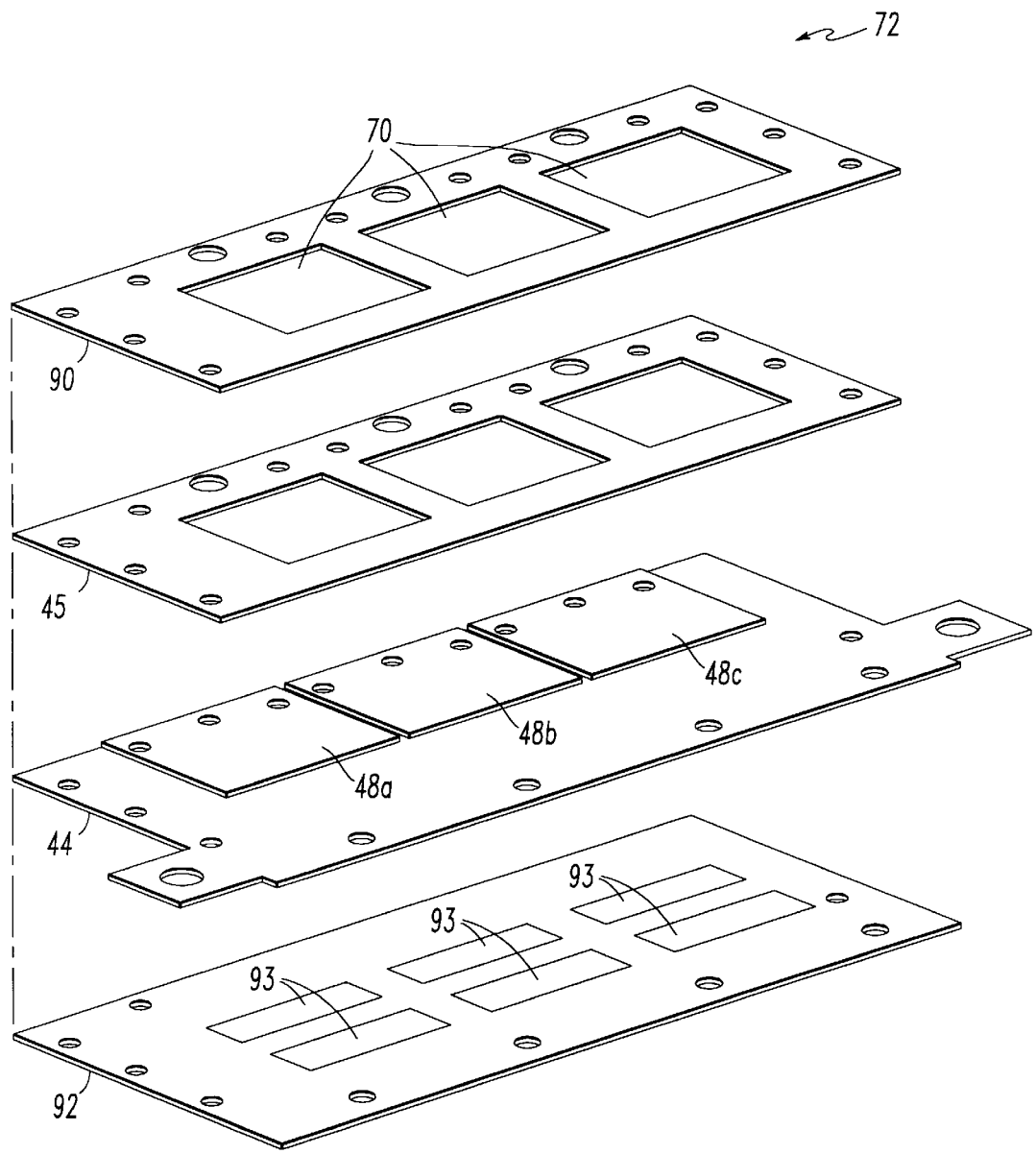
FIG. 8 is an exploded view of certain laminated components of FIG. 7.

The laminated structure 72 is illustrated in more detail in exploded form in FIG. 8. The structure includes an upper, or first, printed circuit (pc) board 90 which is used to distribute gate drive signals from the gate drive circuits 62 (FIG. 5). A lower, or second pc board 92, having apertures to accommodate heat sinks 30, is blank and serves as a stiffening member and creates a seal for cooling oil.

Sandwiched between the first and second pc boards 90 and 92 are planar positive and negative buses 44 and 45, with the laminated layers being held together by means of thin, high-temperature, high-dielectric adhesive sheets (not illustrated).

Figure 9:
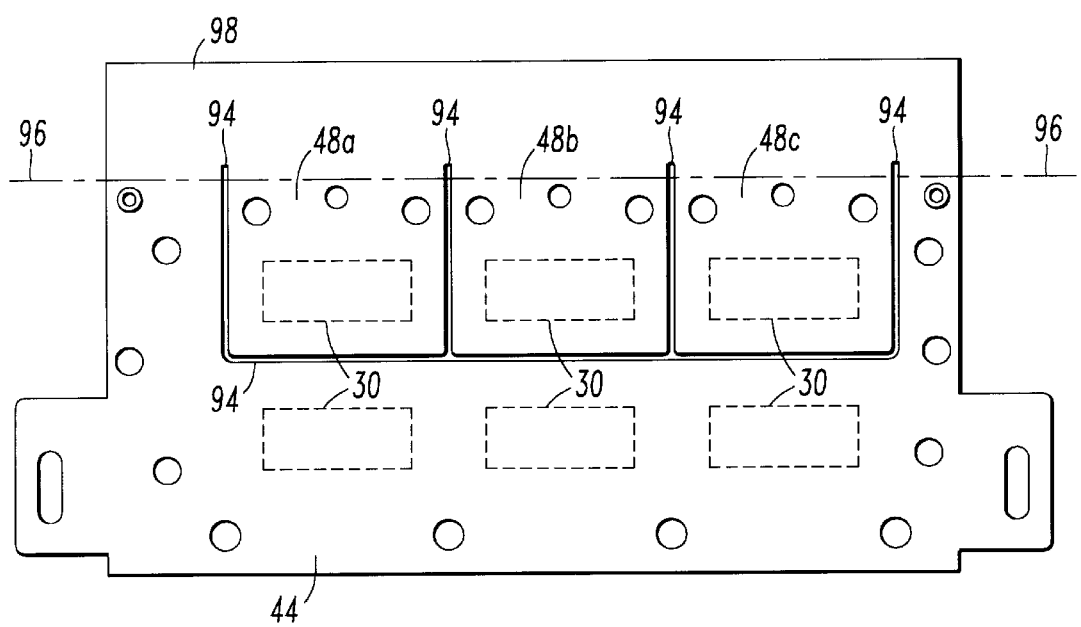
FIG. 9 is a plan view of one of the laminated layers of FIG. 8.

The output buses 48a, 48b and 48c are coplanar with the positive bus 44 and are initially formed from the same piece of copper (or other suitable electrically conductive material). This is illustrated in FIG. 9, which is a plan view of bus 44 and also shows the locations of the porous copper heat exchangers 30 brazed to the underside thereof. These 6 heat exchangers may be formed simultaneously in a furnace brazing operation where copper particles are brazed to each other and to the copper bus at the same time, prior to laminating the layers together.

The layer illustrated in FIG. 9 starts out as one piece of copper which, in addition to holes, has slots 94 cut through it, forming three tabs which will become the output buses 48a, 48b and 48c. The positions of the three tabs are held accurately relative to each other and the positive bus 44 since they are all part of the same piece of metal. Therefore, no special fixture is necessary for the lamination process to hold the tabs in place. After lamination, the layer is cut along the trim line 96 and the excess piece of copper 98 is removed.

Figure 10:
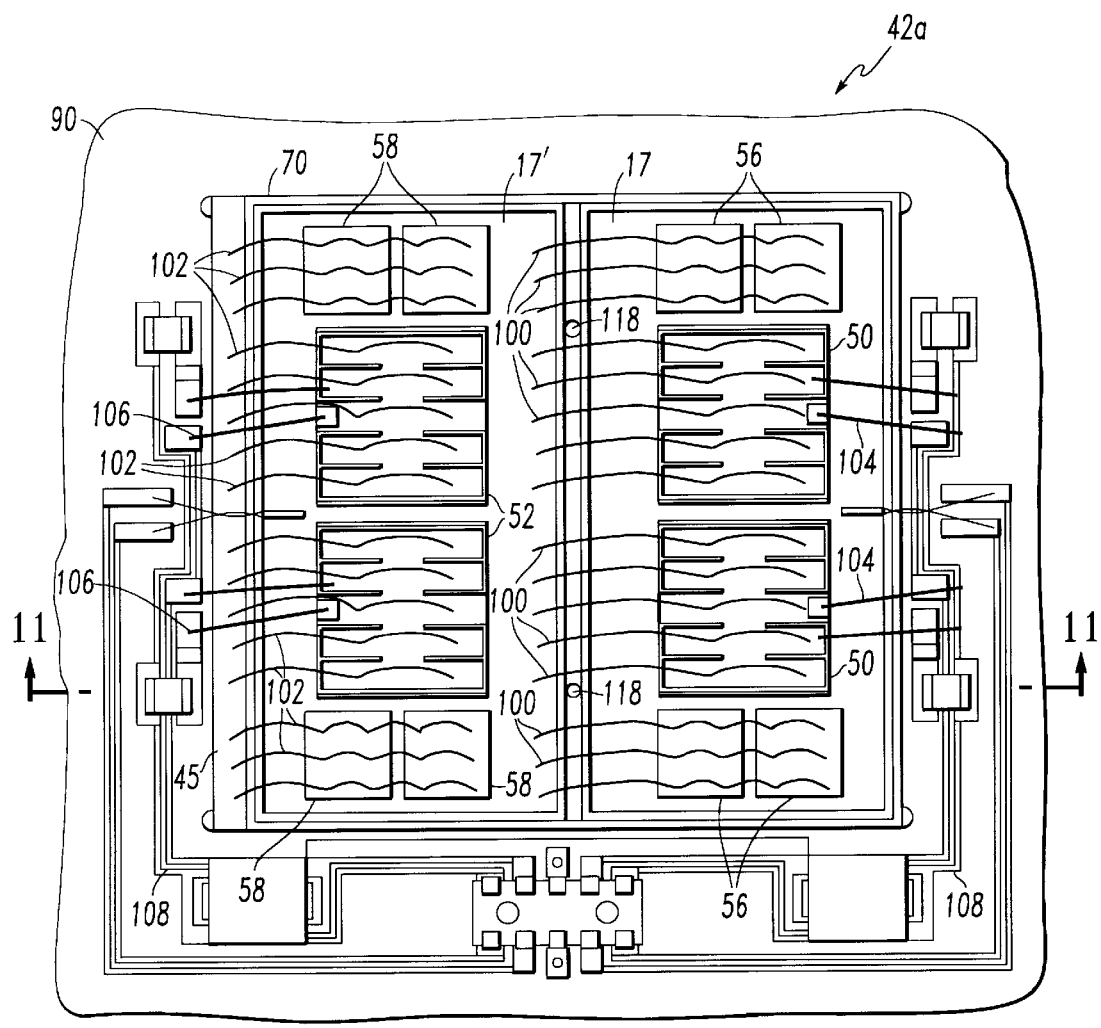
FIG. 10 is a plan view of a switching circuit of FIG. 7.
Figure 11:
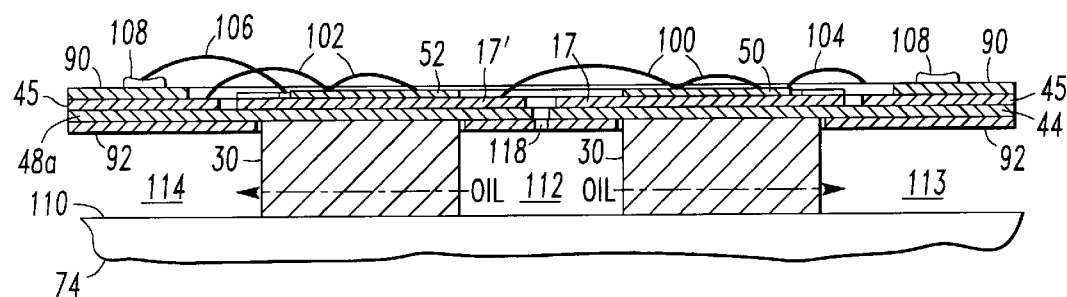
FIG. 11 is a cross-sectional view along line 11—11 of FIG. 10.

The laminated structure 72, along with phase A switching circuit 42a, by way of example, is illustrated in plan view in FIG. 10, and in FIG. 11, which is a view along line 11—11 of FIG. 10. Four IGBT chips 50 and 52, and eight diode chips 56 and 58 are utilized to conduct the high currents, as are a plurality of wire leads 100 and 102. Gate signals are provided to the IGBTs 50 and 52 via respective leads 104 and 106 connected to printed circuitry 108 on pc board 90.

The semiconductor chips defining IGBT(S) 50 and diode (s) 56, and IGBT(s) 52 and diode(s) 58 are mounted on respective thermally and electrically conducting carriers 17 and 17' which closely match the CTE of the semiconductors. IGBT 50, which is mounted on carrier 17, has its collector (see also FIG. 5) connected to the positive bus 44 via its carrier 17. Its emitter is connected to carrier 17' via wire leads 100 and carrier 17', in turn, is bonded, such as by soldering, to output bus 48a.

IGBT 52, which is mounted on carrier 17', has its collector electrically connected to output bus 48a (and to the emitter of IGBT 50) via carrier 17', and its emitter is connected to negative bus 45 via wire leads 102.

As best seen in FIG. 11, the porous metal heat exchangers 30, brazed to the underside of buses 44 and 48a, contact the floor 110 of lower manifold housing 74. This arrangement defines a central channel 112 and two outside channels 113 and 114 for transport of a dielectric cooling fluid, such as oil. The cooling oil enters the housing in central channel 112 and flows toward the viewer. Some oil may be utilized to cool the wire leads 100 and 102, as well as the top surfaces of the semiconductors, by the provision of small apertures 118 in the center of the laminated structure 72. Such cooling oil may be returned to the oil outlet 27 in lower manifold housing 74, or to an oil outlet in the upper manifold housing 75.

Figure 12:
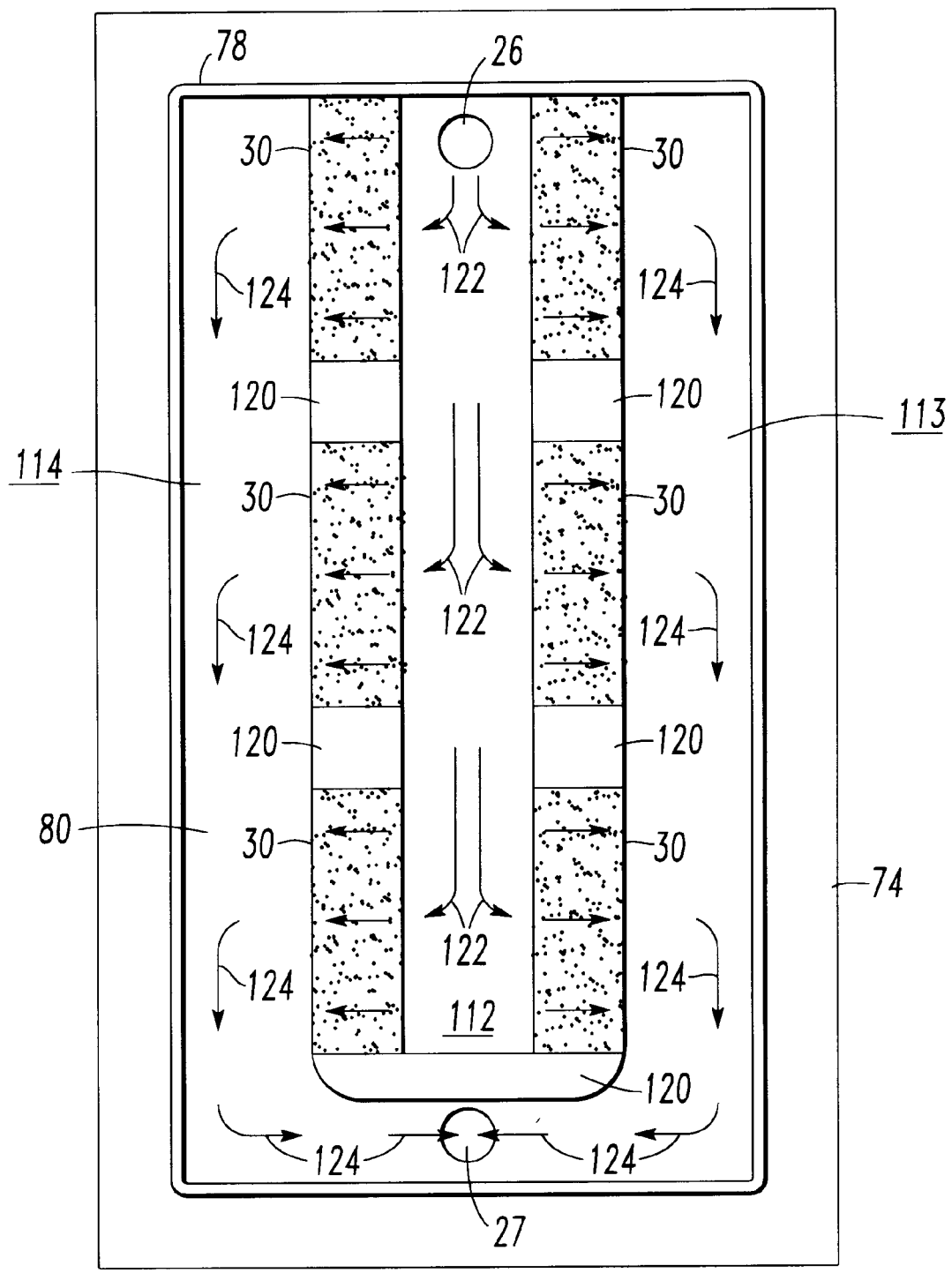
FIG. 12 is a plan view of the path of cooling fluid in the arrangement of FIG. 7.

With additional reference to FIG. 12, which is a plan view of the lower manifold housing 74, cooling oil is supplied at inlet 26 and flows in the central channel 112. Blocks 120, in conjunction with the heat exchangers 30 (two per each switching circuit, as in FIG. 11) define the channels through which the cooling oil flows. With the introduction of the cooling oil into central channel 112, as indicated by arrows 122, the oil is directed through the six heat exchangers 30 in parallel so that all six receive the same flow rate of oil at the same inlet temperature. After passage through the heat exchangers 30, and as indicated by arrows 124, the oil flows in respective channels 113 and 114 to the outlet 27. Although the preferred flow direction is from the central channel 112 to the outside channels 113 and 114, the flow can be reversed if other design features require it.

FIGS. 13 and 14 illustrate a laminar bus 130 which has, as an integral portion thereof, one or more thermally and electrically conducting carriers 132. By way of example, the structure may be formed by introducing molten copper into a mold having one or more carbon fiber mats placed therein at predetermined locations. The amount and location of carbon fibers in conjunction with the copper, define the carrier and tailors its CTE to that of a semiconductor which will eventually be brazed to the carrier, as previously described. The structure may then be used as is, or may be cut into separate sections, each containing a bus with integral carrier.

Accordingly, there has been described an improved arrangement for cooling a semiconductor circuit such as a multiphase power bridge which may be used in conjunction with a vehicle propulsion system, by way of example. The design significantly improves thermal performance by reducing the thermal resistance between a semiconductor and a cooling fluid. This reduces the amount, and therefore the cost of semiconductor needed for a given power requirement.

Although the present invention has been described with a certain degree of particularity, it is to be understood that various substitutions and modifications may be made without departing from the spirit and scope of the invention as defined in the appended claims.

What is claimed is:

1. A cooling arrangement for cooling a semiconductor circuit, comprising:

(A) a semiconductor having a predetermined CTE;

(B) a carrier having first and second sides, and having a predetermined CTE;

(C) said semiconductor being mounted on, and affixed to said first side of said carrier;

(D) said carrier being both thermally and electrically conductive;

(E) the difference between said CTEs of said semiconductor and said carrier being no more than about 1 to 2 ppm per degree centigrade;

(F) means making electrical connection with said semiconductor on one side thereof;

(G) means making electrical connection with said carrier;

(H) a cooling assembly thermally connected to said second side of said carrier for extracting heat therefrom conducted from said semiconductor;

(I) said cooling assembly including a dielectric housing having a cooling fluid inlet for introduction of a cooling fluid, and a cooling fluid outlet.

2. An arrangement according to claim 1 wherein:

(A) said semiconductor is brazed to said carrier.

3. An arrangement according to claim 1 wherein:

(A) said semiconductor is selected from the group consisting of silicon, silicon carbide, gallium arsenide and gallium nitride.

4. An arrangement according to claim 1 wherein:

(A) said cooling fluid is a dielectric oil.

5. An arrangement according to claim 1 which includes:

(A) a heat exchanger in the fluid flow path between said inlet and said outlet.

6. An arrangement according to claim 5 wherein:

(A) said heat exchanger is a porous metal block.

7. An arrangement according to claim 6 wherein:

(A) said dielectric housing has a floor portion; and (B) said porous metal block touches said floor portion.

8. An arrangement according to claim 1 wherein:

(A) said carrier is a metal matrix composite.

9. An arrangement according to claim 8 wherein:

(A) said metal matrix composite is a copper/graphite composite.

10. An arrangement according to claim 1 wherein said means for making electrical connection with said carrier includes:

(A) an electrical bus connected to said second side of said carrier.

11. An arrangement according to claim 10 wherein:
(A) said bus is planar.
12. An arrangement according to claim 11 wherein:
(A) said bus is soldered to said carrier.
13. An arrangement according to claim 1 wherein:
(A) said semiconductor is a circuit having at least one high power switching device.
14. An improved cooling arrangement for a power bridge having a plurality of ac phases, each said phase comprising:
(A) a semiconductor switching circuit including at least first and second serially connected high power semiconductor switching elements having a predetermined CTE;
(B) said first and second switching elements being bonded to respective first and second thermally and electrically conducting carriers each having a predetermined CTE closely matching that of the switching element to which it is bonded;
(C) a laminated structure including predetermined layers having a window therein into which said carriers and switching elements are positioned, and including positive, negative and output planar electrical buses;
(D) means making predetermined electrical connection of said switching elements to said positive, negative and output buses;
(E) heat exchangers thermally connected to predetermined ones of said buses;
(F) a dielectric housing having upper and lower portions connected together, with said laminated structure sandwiched therebetween, along with said switching elements, buses and heat exchangers;
(G) said dielectric housing having a cooling fluid inlet for introduction of a cooling fluid, and a cooling fluid outlet;
(H) said heat exchangers being in the fluid flow path between said inlet and said outlet.
15. An arrangement according to claim 14 wherein:
(A) said negative bus is coplanar with said carriers.
16. An arrangement according to claim 14 wherein:
(A) said positive bus is coplanar with said output bus.
17. An arrangement according to claim 14 wherein:
(A) said laminated structure includes upper and lower printed circuit boards, with said buses sandwiched therebetween.
18. An arrangement according to claim 17 wherein:
(A) said upper and lower portions of said housing include respective O-rings; and
B) said O-rings make a fluid tight seal with said upper and lower printed circuit boards, respectively.
19. An arrangement according to claim 18 wherein:
(A) said lower printed circuit board includes at least one aperture through which said cooling fluid may flow to contact and cool said switching elements.
20. An arrangement according to claim 14 wherein:
(A) said lower portion of said housing has a floor; and wherein (B) said heat exchangers contact said floor.
21. An arrangement according to claim 14 wherein:
(A) said heat exchangers are porous metal blocks.
22. An arrangement according to claim 21 wherein:
(A) means are provided within said lower portion of said housing to form, along with said heat exchangers, a central fluid transport channel and two outside fluid transport channels, whereby said cooling fluid is introduced into said central channel and flows through said heat exchangers to said outside channels and then to said fluid outlet.
23. An arrangement according to claim 22 wherein:
(A) said cooling fluid is a dielectric oil.
24. An arrangement according to claim 22 wherein:
(A) said cooling fluid flows through said heat exchangers, in parallel, to said outside channels.
25. An arrangement according to claim 18 wherein:
(A) at least one said carrier is coplanar with, and is formed as an integral part of, a said bus.

* * * * *